(12) United States Patent
Fruehling

(10) Patent No.: US 12,187,599 B2
(45) Date of Patent: Jan. 7, 2025

(54) REDUCTION OF RINGING AND INTERMODULATION DISTORTION IN A MEMS DEVICE

(71) Applicant: Texas Instruments Incorporated, Dallas, TX (US)

(72) Inventor: Adam Joseph Fruehling, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 519 days.

(21) Appl. No.: 17/491,416

(22) Filed: Sep. 30, 2021

(65) Prior Publication Data

US 2023/0101598 A1   Mar. 30, 2023

(51) Int. Cl.
*B81B 3/00* (2006.01)
*G02B 26/08* (2006.01)
*H01G 5/01* (2006.01)
*H01H 1/00* (2006.01)

(52) U.S. Cl.
CPC ........ *B81B 3/0045* (2013.01); *G02B 26/0833* (2013.01); *H01G 5/01* (2013.01); *H01H 1/0036* (2013.01); *B81B 2201/01* (2013.01); *B81B 2201/0221* (2013.01); *B81B 2201/042* (2013.01); *B81B 2207/03* (2013.01)

(58) Field of Classification Search
CPC .............. B81B 3/0045; B81B 2201/01; B81B 2201/0221; B81B 2201/042; B81B 2207/03; G02B 26/0833; H01G 5/01; H01H 1/0036; H01H 59/0009
See application file for complete search history.

(56) References Cited

U.S. PATENT DOCUMENTS

| 6,992,387 B2 | 1/2006 | Hester et al. |
| 7,473,859 B2 | 1/2009 | Wright et al. |
| 7,515,329 B2 | 4/2009 | Sprague et al. |

(Continued)

FOREIGN PATENT DOCUMENTS

WO    WO-2008061319 A1 *  5/2008  ........... B81B 3/0078

OTHER PUBLICATIONS

A. Morris, S. Cunningham, "Challenges and Solutions for Cost-effective RF-MEMS Packaging," Jan. 4, 2008, IEEE, 2007 32nd IEEE/CPMT International Electronic Manufacturing Technology Symposium (Year: 2008).*

*Primary Examiner* — Tulsidas C Patel
*Assistant Examiner* — Joshua Kiel M Rodriguez
(74) *Attorney, Agent, or Firm* — Ray A. King; Frank D. Cimino

(57) ABSTRACT

Described embodiments include a microelectromechanical system (MEMS) array comprising a first MEMS device that includes a first movable electrostatic plate elastically connected to a first structure, the first movable electrostatic plate having a first mass, a first fixed electrostatic plate, and a first drive circuit having a first drive output coupled to the first fixed electrostatic plate. There is a second MEMS device that includes a second movable electrostatic plate elastically connected to a second structure, the second movable electrostatic plate having a second mass that is different than the first mass, a second fixed electrostatic plate, and a second drive circuit having a second drive output coupled to the second fixed electrostatic plate.

20 Claims, 4 Drawing Sheets

(56) References Cited

U.S. PATENT DOCUMENTS

| | | | |
|---|---|---|---|
| 7,652,547 B1 * | 1/2010 | Wittwer | H03H 9/505 |
| | | | 333/197 |
| 7,747,109 B2 | 6/2010 | Zhong et al. | |
| 7,978,034 B2 | 7/2011 | Naito et al. | |
| 8,626,083 B2 | 1/2014 | Greene et al. | |
| 8,981,875 B2 | 3/2015 | Park | |
| 9,573,801 B2 | 2/2017 | Gupta et al. | |
| 9,711,291 B2 | 7/2017 | Knipe et al. | |
| 9,966,194 B2 | 5/2018 | Gupta et al. | |
| 2003/0133196 A1 * | 7/2003 | Wine | G02B 27/0172 |
| | | | 359/578 |
| 2016/0156337 A1 * | 6/2016 | Shay | H03H 1/02 |
| | | | 333/172 |

\* cited by examiner

REDUCTION OF RINGING AND INTERMODULATION DISTORTION IN A MEMS DEVICE

BACKGROUND

This description relates to microelectromechanical systems (MEMS). A capacitive MEMS switch or varactor uses a moving plate, beam, diaphragm, comb or sensing element, which changes the capacitance. Ohmic MEMS switches are controlled by electrostatically controlled cantilevers, clamped beams or plates.

At low radio frequency (RF) power levels, MEMS capacitive switches and varactors can be more linear than conventional semiconductor switches or varactors in some cases. However, at higher RF power levels, harmonic and intermodulation distortion can become a significant problem in MEMS devices if the tone spacings are below the mechanical resonance response, or approach the frequency range of higher order vibrational modes.

Harmonics may be generated in any type of RF transmission system. However, the problem is exacerbated in MEMS devices if the tone frequency spacing is small. A small difference between tone frequencies in a MEMS device can result in a beat frequency, leading to harmonic products. The harmonic products are unwanted noise having a sinusoidal character on the main propagation signal. The modulation can also introduce unwanted phase response or frequency content to the primary signal.

This effect is similar to amplitude modulation (AM) except that, unlike with AM, the MEMS modulation is completely unwanted. The modulation in MEMS devices is not for the purpose of carrying useful information as is the case with AM. Instead, the MEMS harmonic products produce an amplitude modulation of unwanted noise at discrete tone frequencies, resulting in intermodulation distortion.

SUMMARY

The first described embodiment presents a microelectromechanical system (MEMS) array comprising a first MEMS device that includes a first movable electrostatic plate elastically connected to a first structure, the first movable electrostatic plate having a first mass, a first fixed electrostatic plate, and a first drive circuit having a first drive output coupled to the first fixed electrostatic plate. There is a second MEMS device that includes a second movable electrostatic plate elastically connected to a second structure, the second movable electrostatic plate having a second mass that is different than the first mass, a second fixed electrostatic plate, and a second drive circuit having a second drive output coupled to the second fixed electrostatic plate.

The second described embodiment presents a MEMS varactor array comprising a first MEMS device that includes a first fixed electrostatic plate coupled to a first input signal terminal, a second fixed electrostatic plate coupled to a first output signal terminal, and a first movable electrostatic plate elastically connected to a first structure, the first movable electrostatic plate having a first mass. The first movable electrostatic plate forms first and second capacitors with the first and second fixed electrostatic plates, respectively, and there is a first drive circuit having a first drive output coupled to the first movable electrostatic plate. Further, there is a second MEMS device that includes a third fixed electrostatic plate coupled to a second input signal terminal, a fourth fixed electrostatic plate coupled to a second output signal terminal, and a second movable electrostatic plate elastically connected to a second structure, the second movable electrostatic plate having a second mass that is different than the first mass. The second movable electrostatic plate forming third and fourth capacitors with the third and fourth fixed electrostatic plates, respectively, and there is a second drive circuit having a second drive output coupled to the second movable electrostatic plate.

The third described embodiment presents a MEMS array comprising a first MEMS device that includes a first movable electrostatic plate elastically connected to a first structure, a first fixed electrostatic plate, and a first drive circuit having a first drive output coupled to the first fixed electrostatic plate. There is a first signal input terminal coupled to one of either the first movable plate or the first fixed plate, a first drive circuit having a first drive voltage output terminal providing a first drive signal, and a first filter coupled to the first drive voltage output terminal, the first filter having a first frequency response. There is a second MEMS device that includes a second movable electrostatic plate elastically connected to a second structure, a second fixed electrostatic plate, and a second drive circuit having a second drive output coupled to the second fixed electrostatic plate. There is a second signal input terminal coupled to one of the second movable plate or the second fixed plate, a second drive circuit having a second drive voltage output terminal providing a second drive signal, and a second filter coupled to the second drive voltage output terminal, the second filter having a second frequency response that is different than the first frequency response.

DETAILED DESCRIPTION

Figure 1:
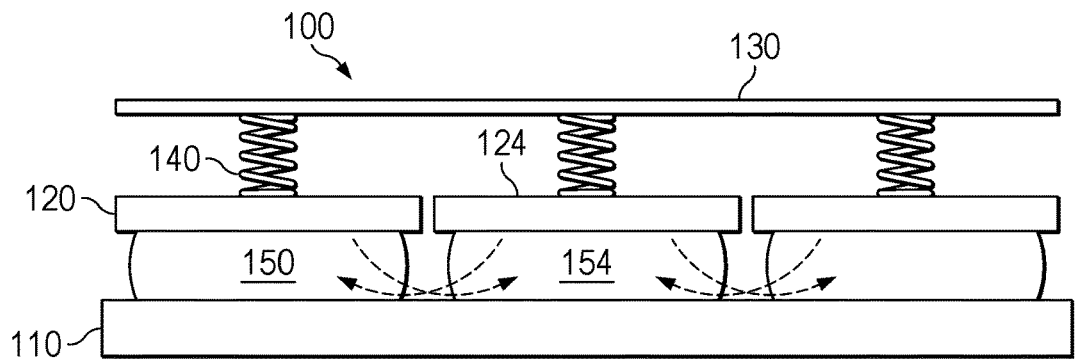
FIG. 1 shows an example of a mass spring MEMS system.

In this description, the same reference numbers depict the same or similar (by function and/or structure) features. The drawings are not necessarily drawn to scale.

In some cases, RF MEMS may be more linear than their solid-state counterparts. However, when tone spacings decrease or if either the RF power or modulation rate increases, discrete noise tone frequencies can propagate into the RF signal path. This tone problem can be accentuated when multiple RF MEMS are arrayed together or operated at a low package pressure. One potential solution to the noise tone problem is to shift the mechanical resonant frequency or higher order vibrational modes of the MEMS device away from the application-specific sensitive frequencies, and rely on gas damping to attenuate the vibrations below an acceptable threshold level.

A MEMS varactor has a fixed plate and a moveable plate forming a capacitor. The intermodulation distortion comes from unwanted movement of the fixed or movable plate in response to mechanical or electrical noise sources. MEMS devices have two or more electrostatic plates. One of the electrostatic plates has a voltage applied to it, and another electrostatic plate has no applied voltage or is grounded. The electrostatic plates are controlled by varying the voltage on the first plate, creating an electrostatic field between the plates that attracts the electrostatic plates to each other. The movable electrostatic plate has an elastic mechanism attached to it providing an opposing or repelling force. The electrostatic plate with the voltage applied can be either the fixed plate or the movable plate.

Some MEMS devices are packaged in a vacuum. Other MEMS devices are packaged at an atmosphere with a gas filling the gap between the two electrostatic plates. In the presence of a gas, a field emission current can flow between the electrostatic plates. The field emission current can become ionized, causing an electrostatic discharge known as arcing. Arcing is similar to a microscale lightning bolt between the first plate and the second plate. Arcing is potentially harmful to the MEMS device, and therefore it is desirable to enact measures to avoid arcing. Arcing does not occur in devices packaged in a vacuum because the gas will not ionize in a vacuum. However, not all systems allow operation of the MEMS device in a vacuum because the device relies on the damping effect of a gas between the plates to stop oscillation of the beam in the MEMS device following movement of one or more of the movable electrostatic plates.

As the gas pressure inside the MEMS device increases, the damping effect of the gas will increase. However, there is also an increasing probability of an arcing event as the gas pressure increases for a given voltage and distance between the electrostatic plates.

Intermodulation distortion and harmonic products can exist as a result of electrical noise or the mechanical resonance of the MEMS beam. When the beam is moved, especially when going from a contact state to a non-contact state, the beam may tend to ring for an extended period, especially when the MEMS device is packaged in a vacuum if there is nothing to damp the ringing. There is a need for a MEMS device having sufficient damping of oscillations that does not increase the susceptibility to arcing.

FIG. 1 shows an example of a mass spring MEMS system 100. MEMS system 100 has a substrate 110 and a movable plate 120. In some example systems, movable plate 120 can be a mirror, a capacitor plate, a switch contact or some other similar object. Movable plate 120 is elastically connected to anchor 130 by spring 140. If device 100 is not packaged in a vacuum, there will be a gas 150 between movable plate 120 and the substrate 110.

As an electrostatic field attracts the movable plate 120 toward the substrate 110 and causes movable plate 120 to move toward substrate 110, the gas 150 between movable plate 120 and substrate 110 will be compressed. In many cases, the MEMS devices are packed in close proximity to one another. As the gas 150 is compressed, the gas is pushed out from between movable plate 120 and substrate 110. As gas 150 is pushed out, some of the gas 150 may push into the adjacent gas cloud 154 between the substrate 110 and movable plate 124, disrupting movable plate 124. Therefore, a cross-coupling can occur between adjacent MEMS devices if the gaps between the adjacent devices are not large enough for the gas to escape without disturbing the adjacent device. The closer that two adjacent devices are to one another, the more cross-coupling the devices will have between their beams. The increased cross-coupling between MEMS devices causes a higher intermodulation distortion.

In addition to contributing to an increased probability of arcing, reliance on gas damping to eliminate ringing can have other consequences, such as degradation in the device mechanism leading to stiction failures in contact devices and to surface-dependent creep. Also, the gas may cause surface oxidation on the electrostatic plates that can affect the mechanical performance if the surface-to-volume ratio of the mechanical components is small.

Active electrical damping using high-speed compensation techniques in the drive signal can reduce ring times in MEMS devices. Electrical damping techniques such as multi-step drive and pulse drive waveforms can offer additional margin against oscillations and reduce the dependence on gas pressure for damping of oscillations.

However, electrical damping may require tuning of individual electrical circuits to account for unit-to-unit differences in mechanical parameters, resulting in increased production cost and cycle time. Some electrical damping compensation techniques require a very high slew rate on the drive signal, and are less effective without the high slew rate. Also, some electrical damping compensation techniques require three discrete voltage levels on the drive signal output to be effective, and not all systems have multiple drive voltages available. Further, if the device changes mechanically over time, the timing of the drive signal steps or pulses must change accordingly to remain effective. Adding real-time monitoring to continually update the drive waveforms adds circuit complexity and size. For MEMS devices in the field, it may not practical to update the electrical drive waveform, and having improper drive waveform timing can actually make the ringing worse due to secondary collapse and higher order harmonics.

The effect of resonances in MEMS devices is compounded by having the resonance of each element in a MEMS device at roughly the same frequency or frequencies. Having the resonance of each element in a MEMS device at a single frequency can produce a noise tone at that frequency having a relatively strong magnitude due to an underdamped ringing in the MEMS device.

An alternative approach for mitigating resonances in a MEMS device is to spread out (i.e. scatter) the resonant frequencies of the individual elements in the MEMS device. By spreading out the resonant frequencies of the individual elements, the effect is a spread-spectrum noise floor (e.g. white noise) having a lower magnitude, instead of a single frequency noise tone having a higher magnitude. Spreading out the resonant frequencies of individual elements to reduce ringing can be accomplished by either making an electrical adjustment to the rise times of the individual drive signals, or by making a mechanical adjustment to the beams in the individual elements.

Figure 2:
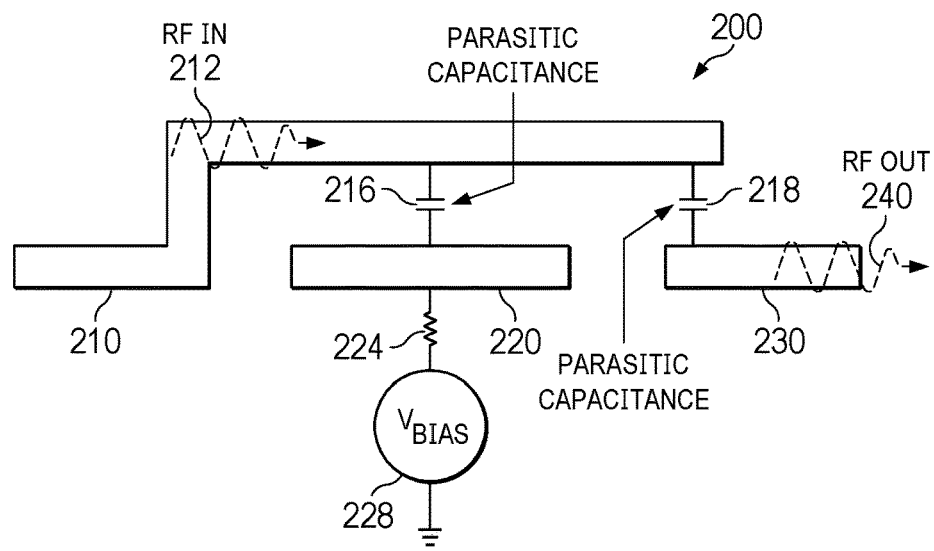
FIG. 2 shows a block diagram of an example RF MEMS switch.

FIG. 2 shows a block diagram of an example RF MEMS switch 200. The MEMS switch includes a movable electrostatic plate 210 and a fixed electrostatic plate 220. The fixed electrostatic plate 220 has a voltage provided to it by voltage drive circuit $V_{BIAS}$ 228 through resistor 224. Input signal RF_IN 212 is provided to an input terminal of the movable electrostatic plate 210.

$V_{BIAS}$ 228 is a circuit providing to fixed electrostatic plate 220 a drive signal that switches a drive signal off and on.

When the drive signal is applied to the fixed electrostatic plate 220, an electromagnetic force is created between the fixed electrostatic plate 220 and the movable electrostatic plate 210 attracting the fixed electrostatic plate 220 to the movable electrostatic plate 210. The electromagnetic force between the plates causes movable electrostatic plate 210 to contact output terminal 230. Movable electrostatic plate 210 contacting output terminal 230 provides the output signal RF OUT 240 to output terminal 230. Ideally, RF OUT 240 would be an identical signal to RF IN 212. However, intermodulation distortion and crosstalk between MEMS devices can distort the signal provided at RF OUT 240. Parasitic capacitance 216 between fixed electrostatic plate 220 and movable electrostatic plate 210 contributes to the distortion of the signal between RF IN 212 and RF OUT 240. Parasitic capacitance 218 between movable electrostatic plate 210 and output terminal 230 further contributes to the distortion between the signal at RF IN 212 and the signal at RF OUT 240 by providing a leakage path for RF energy.

Figure 3:
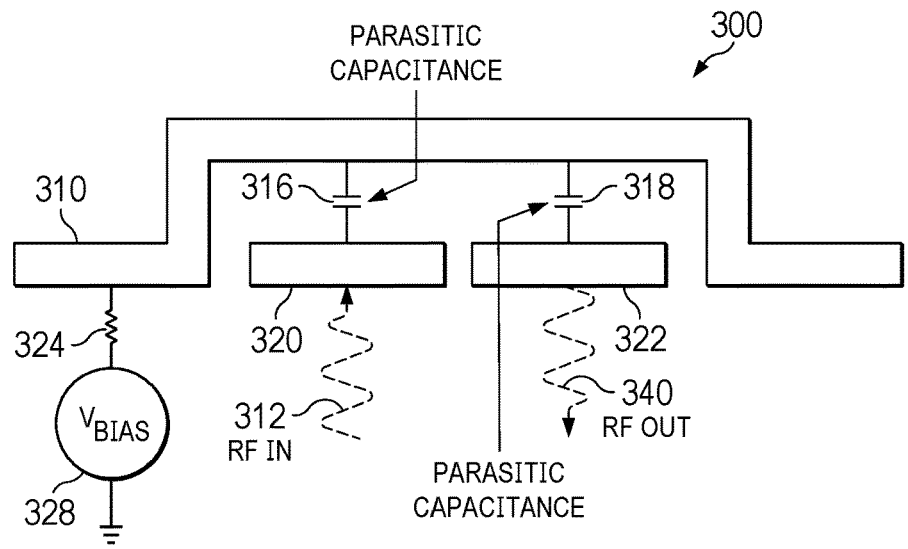
FIG. 3 shows a block diagram of an example RF MEMS varactor.

FIG. 3 shows a block diagram of an example RF MEMS varactor 300. The MEMS varactor includes a movable electrostatic plate 310 and fixed electrostatic plates 320 and 322. Input signal RF_IN 312 is applied to an input terminal of fixed electrostatic plate 320. Output signal RF_OUT 340 is provided at the output of fixed electrostatic plate 322. $V_{BIAS}$ 328 is a circuit providing a switching drive signal to the movable electrostatic plate 310 through resistor 324. When the drive signal is applied to the movable electrostatic plate 310, an electromagnetic force is created between fixed electrostatic plates 320 and 322 and the movable electrostatic plate 310, attracting fixed electrostatic plates 320 and 322 toward the movable electrostatic plate 310.

Movable electrostatic plate 310 moves up and down changing the capacitance between fixed electrostatic plates 320 and 322 and the movable electrostatic plate 310, thus modulating the RF IN signal 312 from fixed electrostatic plate 320 to the RF OUT signal 340 at fixed electrostatic plate 322. However, intermodulation distortion and crosstalk between MEMS devices can distort the signal provided at RF OUT 340. Parasitic capacitance 316 between fixed electrostatic plate 320 and movable electrostatic plate 310 contributes to the distortion between RF IN 212 and RF OUT 240. Parasitic capacitance 318 between fixed electrostatic plate 322 and movable electrostatic plate 310 further contributes to the distortion between RF IN 312 and RF OUT 340.

The intermodulation distortion in RF MEMS switch 200 and RF MEMS varactor 300 is compounded by having the electrical resonance of each MEMS element at roughly the same frequency, producing a noise tone having a relatively strong magnitude at that frequency, leading to an underdamped ringing in the MEMS device. However, the resonant frequencies of the individual elements can be spread out to produce a spread-spectrum noise floor by adjusting the rise time and/or fall time of the drive signal from $V_{BIAS}$ 328 for each individual element in a MEMS device.

Figure 4:
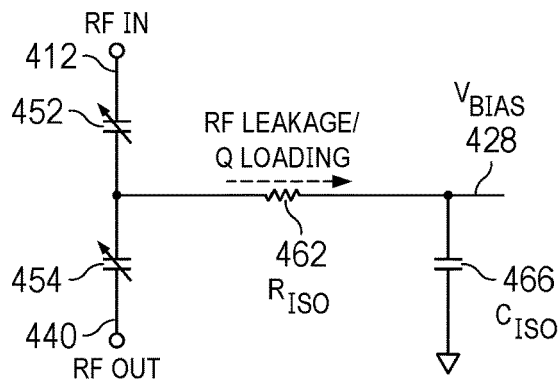
FIG. 4 shows an example of a lowpass filter for an RF varactor circuit in which the capacitance and resistance values are customized to provide different drive signal characteristics for adjacent elements in a MEMS array.

FIG. 4 shows an example of a lowpass filter for an RF varactor circuit in which the capacitance and/or resistance values are customized to provide different drive signal characteristics for adjacent or nearby elements in a MEMS array. Varactors 452 and 454 are configured as two variable capacitors in series. The RF IN terminal 412 is coupled to a first terminal of varactor 452. The second terminal of varactor 452 is coupled to a first terminal of varactor 454. The RF OUT terminal 440 is coupled to a second terminal of varactor 454. A first terminal of resistor $R_{iso}$ 462 is coupled to the second terminal of varactor 452. A second terminal of resistor $R_{iso}$ 462 is coupled to a first terminal of capacitor $C_{iso}$ 466 and to $V_{BIAS}$ 428. The second terminal of capacitor $C_{iso}$ 466 is coupled to ground. The combination of resistor $R_{iso}$ 462 and capacitor $C_{iso}$ 466 make up a lowpass filter that can be used to customize the drive signal characteristics of $V_{BIAS}$ 428 for each element in a MEMS array. The values of $R_{iso}$ 462 and $C_{iso}$ 466 can be varied from element to element in the MEMS array to create a spread spectrum response in the intermodulation distortion.

In one example, a MEMS varactor includes a five-bit segregated MEMS array having 31 elements in the array. The MEMS array is binarily weighted, so that bit 0 has one element, bit 1 has two elements, bit 2 has four elements, bit 3 has eight elements, and bit 4 has sixteen elements. Together, the 31 elements provide five bits of variable capacitance in the varactor. Each of the elements has a corresponding movable electrostatic plate and fixed electrostatic plate. Each of the elements in a given bit are driven together, and each of the elements in a given bit receive the same bias signal to drive the movable plate.

In at least one example, the capacitance of $C_{iso}$ 466 remains the same for each of the elements, and the resistance of $R_{iso}$ 462 varies from element to element. In another example, the resistance of $R_{iso}$ 462 is the same for each of the elements, and the capacitance of $C_{iso}$ 466 varies from element to element. In yet another example, both the resistance of $R_{iso}$ 462 and the capacitance of $C_{iso}$ 466 vary from element to element.

Figure 5:
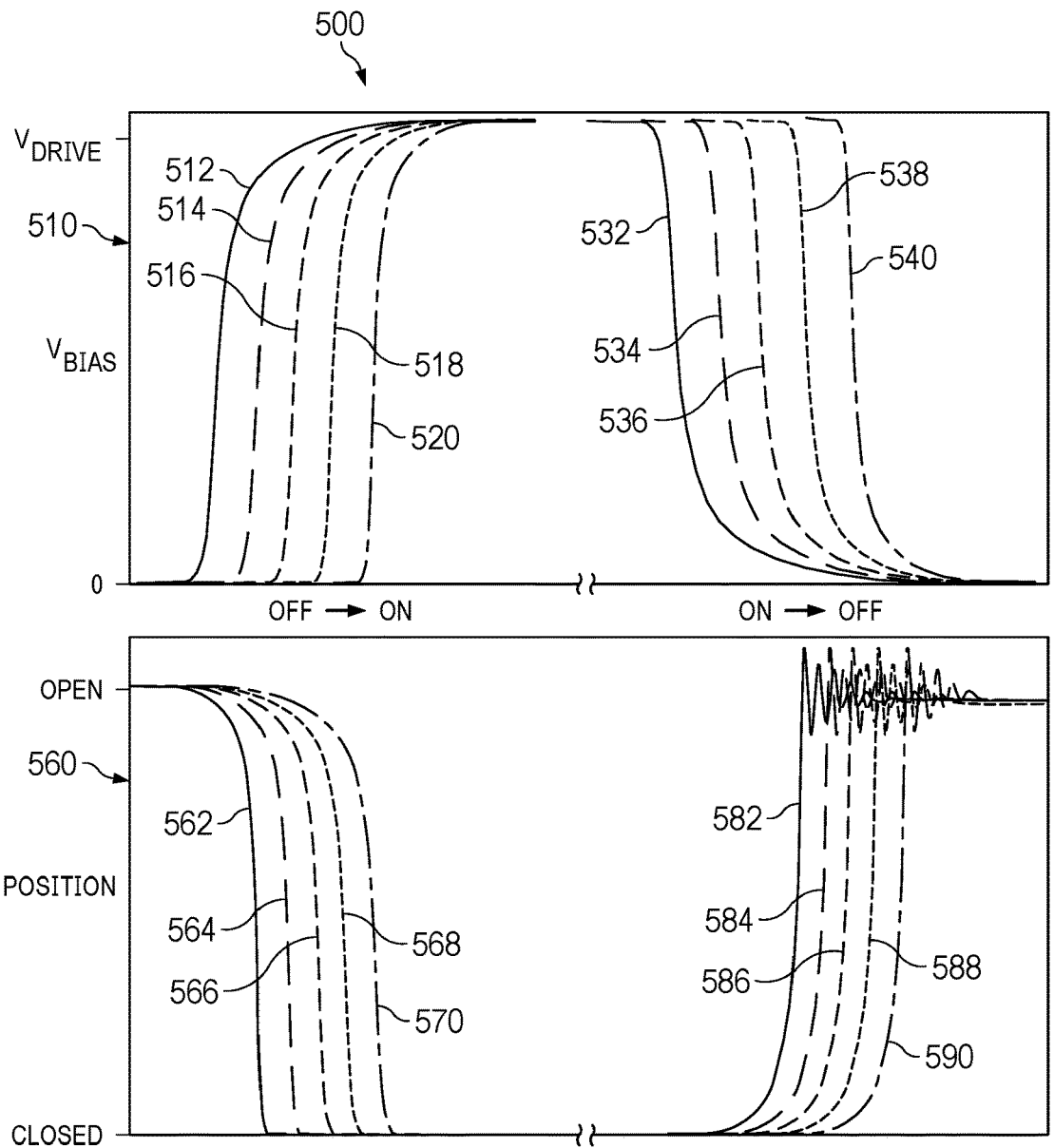
FIG. 5 shows an example plot for responses to changing low pass filter resistance and capacitance values for different bits in a multi-bit MEMS array.

FIG. 5 shows an example response 500 to changing $R_{iso}$ 462 and $C_{iso}$ 466 for different bits in a multi-bit MEMS array. Graph 510 is a plot of voltage versus time for $V_{BIAS}$ 328 for bits 0-4 in a five-bit array for an off-to-on transition and for an on-to-off transition. Line 512 shows bit 0 has the shortest rise time in $V_{BIAS}$ 328 going from off to on. Line 514 corresponds to $V_{BIAS}$ 428 for bit 1 going from off to on. Line 516 corresponds to $V_{BIAS}$ 428 for bit 2 going from off to on. Line 518 corresponds to $V_{BIAS}$ 428 for bit 3 going from off to on. Line 520 corresponds to $V_{BIAS}$ 428 for bit 4 going from off to on.

Line 532 shows bit 0 has the shortest fall time in $V_{BIAS}$ 428 going from on to off. Line 534 corresponds to $V_{BIAS}$ 428 for bit 1 going from on to off. Line 536 corresponds to $V_{BIAS}$ 328 for bit 2 going from on to off. Line 538 corresponds to $V_{BIAS}$ 328 for bit 3 going from on to off. Line 540 corresponds to $V_{BIAS}$ 428 for bit 4 going from on to off. Bit 0, the LSB, shifts the fastest and the MSB, bit 4, shifts the slowest even though the voltage change is initiated simultaneously for all the bits. Bit 4 shifts slower than the other bits because it has either a larger $R_{iso}$ 462 or $C_{iso}$ 466 (or possibly both). The root mechanical structure of the MEMS device is not changed by varying $R_{iso}$ 462 and $C_{iso}$ 466, which would be undesirable. Instead, the responses of the bits are being time-divided, shifting the resonant frequencies of the individual elements to spread the noise induced by the MEMS mechanical response across the frequency spectrum.

Graph 560 is a corresponding plot of the switch position versus time for an off-to-on transition and for an on-to-off transition. Line 562 shows bit 0 has the shortest switch closing time. Line 564 corresponds to the switch closing time for bit 1. Line 566 corresponds to the switch closing time for bit 2. Line 568 corresponds to the switch closing time for bit 3. Line 570 corresponds to the switch closing time for bit 4.

Bit 0, line 582, has the shortest time for the switch to go from closed to open. Line 584 corresponds to the switch opening time for bit 1. Line 586 corresponds to the switch opening time for bit 2. Line 588 corresponds to the switch opening time for bit 3. Line 590 corresponds to the switch opening time for bit 4. As is the case with the drive voltage, the LSB bit 0 opens and closes the fastest and the MSB, bit 4, opens and closes the slowest even though the voltage change is initiated simultaneously for all the bits.

Another way to reduce ringing in a MEMS device by spreading out the resonant frequencies between elements is to modify the elements mechanically. The stiffnesses of the beams in the elements can be changed, but that is not preferred because changing the beam stiffness would change the fundamental mechanical parameters of the device. For a given voltage and spring force in an element, a larger or smaller voltage may then be required to drive the MEMS device, and that is undesirable.

However, there is a mechanical modification that can be made to the MEMS beam without causing undesirable secondary effects, and that is to selectively vary the masses of the beams in the elements in the MEMS device. The relationship between the mass and the resonant frequency of a solid structure is described by the equation:

$$\omega = \sqrt{\frac{k}{M}}$$

where $\omega$ is the resonant frequency, k is the spring constant, and M is the mass of the object. By selectively varying the mass of the beam from one element to another, the resonant frequencies of the beams are varied from one element to another. So, instead of varying the waveform driving the elements, the frequencies at which the mechanical elements respond are mechanically varied selectively across the MEMS device.

Having a mechanical resonance in each of the elements is inherent and unavoidable. However, instead of having each of the elements with the same mechanical resonant frequency, the masses of the elements can be modified to spread the resonant frequencies randomly across the frequency spectrum. Having a spread spectrum response means that no individual frequency carries significantly more energy than any other frequency, so that it comes across as white noise. Even though across the frequency band, the MEMS device may have a slightly higher noise floor, there will be no noise peaks at any discrete frequency.

This can be accomplished by selectively placing devices having beams with different masses throughout the array. This can be done by adding mass or by removing mass from nonactive areas of the device. Mass can be added or subtracted from the device electrostatic plates in a pattern to create a randomized white noise. The individual devices will each still have a resonant frequency, but the resonant frequencies of the elements are distanced from adjacent elements.

Figure 6:
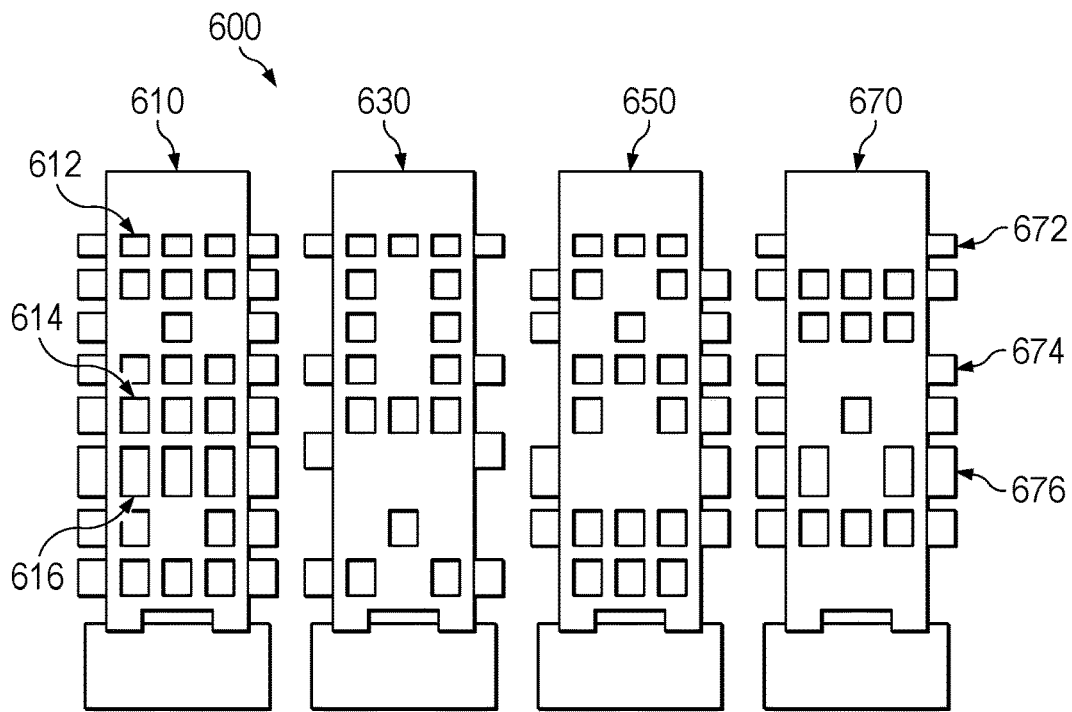
FIG. 6 shows an example of a MEMS switch array having mass selectively added and subtracted to spread out resonant frequencies.

FIG. 6 shows an example MEMS switch array 600 having MEMS devices 610, 630, 650 and 670. Each of the MEMS devices 610, 630, 650 and 670 have mass added and subtracted selectively to spread out their individual resonant frequencies. Variable and non-uniform device perforations 612, 614 and 616 are made in the active area of device 610 to remove mass from device 610. The perforations 612, 614 and 616 may be of different sizes within the device, and each device may have different perforation patterns. For example, perforation 616 may be larger than perforations 612 and 614, and perforation 614 may be larger than perforation 612. The perforations may be rectangular or may be some other shape. The perforations may or may not be laid out on an x-y grid in rows and columns.

Mass may also be added to nonactive areas of the devices. For example, MEMS device 670 has material additions 672, 674 and 676 to add mass to device 670. The material additions 672, 674 and 676 may be of different sizes within the device, and each device may have different patterns of material additions. For example, mass addition 676 may be larger than mass additions 674 and 672, and mass addition 674 may be larger than mass addition 672. The mass additions may be rectangular or may be some other shape. The mass additions may or may not be laid out in rows and columns. Additionally, each beam has a lateral bending mode that can be varied from device to device to vary and spread out the resonant frequencies. Each of the lateral bending modes of a cantilevered beam creates different standing waves on the device beam, which provides another means of varying the mechanical resonant frequency.

Figure 7:
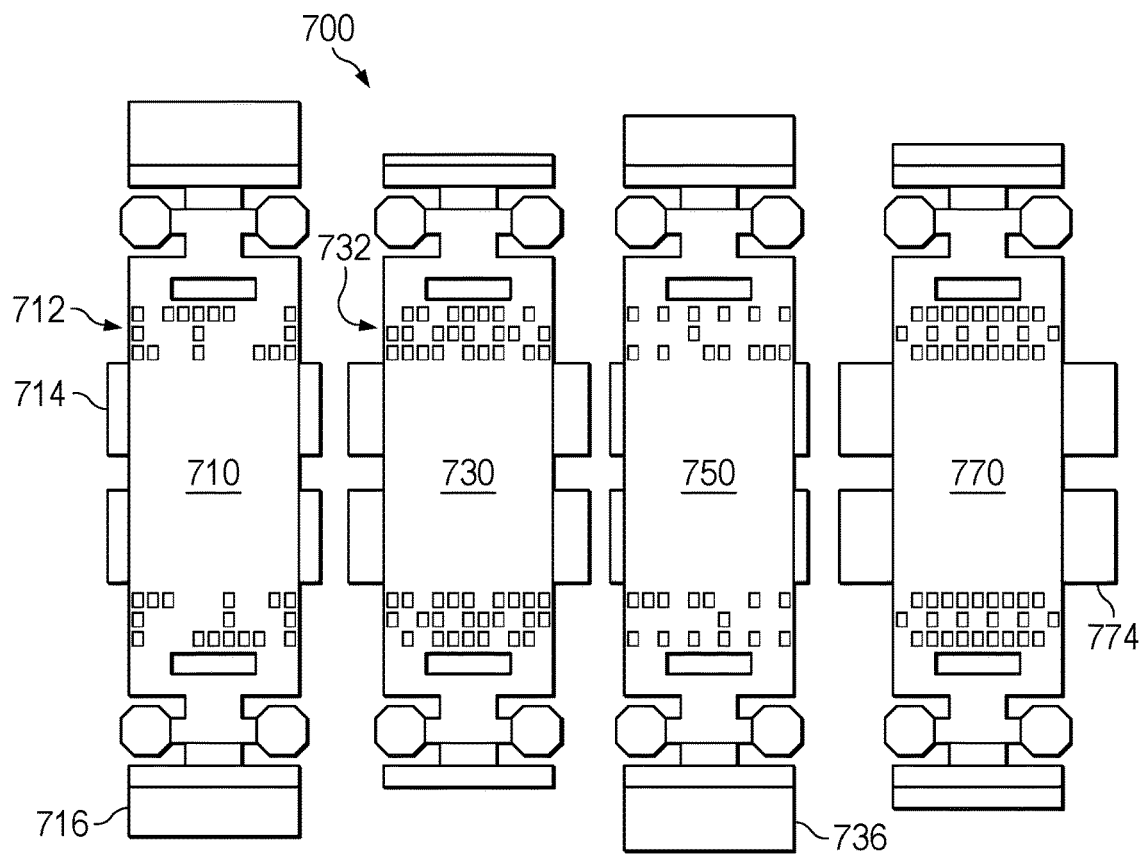
FIG. 7 shows an example of a MEMS varactor array having mass selectively added and subtracted to spread out resonant frequencies.

FIG. 7 shows an example MEMS varactor array 700 having MEMS devices 710, 730, 750 and 770. Each of the MEMS devices 710, 730, 750 and 770 have mass added and subtracted selectively to spread out their resonant frequencies. Variable and non-uniform device perforations are made in the active area of MEMS devices 710, 730, 750 and 770 to remove mass from the devices, such as the perforations 712 made in MEMS device 710. The perforations may be of different sizes within the device, and each device may have different perforation patterns. For example, perforations 712 in MEMS device 710 may have different sizes and different dimensions than the perforations 732 in MEMS device 730. The perforations can be at either or both ends of the MEMS device. The perforations may be rectangular or may be some other shape. The perforations may or may not be laid out on a grid in rows and columns.

Mass may also be added to nonactive areas of the MEMS devices. For example, MEMS device 770 has material additions 774, MEMS device 710 has material additions 714 and 716, and MEMS device 750 has material addition 736 to add mass to the device. The material additions within a device may be of different sizes, and each device may have different patterns and sizes of material additions. For example, material addition 774 may be larger than material addition 714, and material addition 736 674 may be larger than material addition 716 672. The material additions may be rectangular or may be some other shape. The material additions may or may not be laid out in rows and columns. Additionally, each beam has a lateral bending mode that can be varied from device to device to spread out the resonant frequencies. Each of the lateral bending modes of a cantilevered beam creates a different standing wave on the device beam, which provides another means of varying the mechanical resonant frequency.

Figure 8:
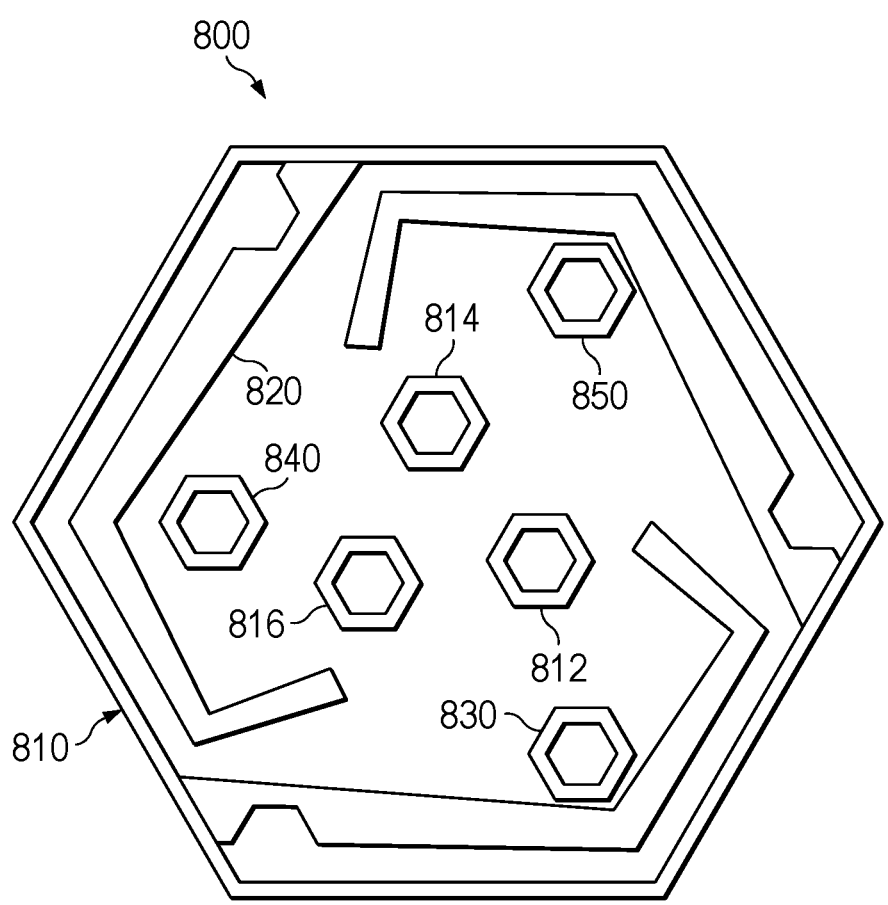
FIG. 8 shows an example single MEMS digital micromirror device (DMD) in an array of DMD devices.

FIG. 8 shows an example MEMS digital micromirror device (DMD) device 800, which is a single DMD device in an array of DMD devices. The DMD device 800 includes mirror 810, spring structure 820, and vias 812, 814 and 816. Vias 812, 814 and 816 connect the spring structure 820 to the mirror structure. Mass may be added selectively to each DMD device in the array to spread out the resonant frequencies of the individual DMD devices. In at least one embodiment, mass is added to DMD device 800 by increasing the size of vias 812, 814 and 816, or any combination thereof. In another embodiment, mass is added to DMD device 800 by increasing the density of vias 812, 814 and 816, or any combination thereof.

In another example embodiment of DMD device 800, additional metal structures 830, 840 and 850 are added to the mirror structure. The metal structures may vary in number, size and density from one DMD device to another in an array. In at least one example, metal structures 830, 840 and 850 are vias. The size and density of the metal structures 830, 840 and 850 may vary within the device, and vary from device to device within an array to spread out the mechanical resonance frequencies throughout the array.

As used herein, the terms "terminal", "node", "interconnection", "lead" and "pin" are used interchangeably. Unless specifically stated to the contrary, these terms are generally used to mean an interconnection between or a terminus of a device element, a circuit element, an integrated circuit, a device, or other electronics or semiconductor component.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

In this description, even if operations are described in a particular order, some operations may be optional, and the operations are not necessarily required to be performed in that particular order to achieve desirable results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A microelectromechanical system (MEMS) array comprising:
   a first MEMS device, including:
      a first movable electrostatic plate elastically connected to a first structure, the first movable electrostatic plate having a first mass and a first lateral bending mode;
      a first fixed electrostatic plate;
      a first drive circuit having a first drive output coupled to the first fixed electrostatic plate;
      a first filter coupled to the first drive output, the first filter having a first frequency response producing a first resonant frequency in the first fixed electrostatic plate; and
   a second MEMS device, including:
      a second movable electrostatic plate elastically connected to a second structure, the second movable electrostatic plate having a second mass different than the first mass;
      a second fixed electrostatic plate;
      a second drive circuit having a second drive output coupled to the second fixed electrostatic plate; and
      a second filter coupled to the second drive output, the second filter having a second frequency response, the second frequency response different than the first frequency response producing a second resonant frequency in the second fixed electrostatic plate that is different than the first resonant frequency.

2. The array of claim 1, wherein:
   the first and second movable electrostatic plates have material added to their periphery, increasing their respective masses; and
   the masses of the material added are different between the first and second movable electrostatic plates.

3. The array of claim 1, wherein:
   the first and second movable electrostatic plates have cutouts having first and second cutout patterns, respectively, the cutouts decreasing the first mass and the second mass; and
   the first and second cutout patterns are different.

4. The array of claim 3, wherein the first and second movable electrostatic plates also have material added to their periphery, and the masses of the material added are different between the first and second movable electrostatic plates.

5. The array of claim 1, wherein the first movable electrostatic plate is pulled toward the first fixed electrostatic plate by an electromagnetic force.

6. The array of claim 5, wherein the first movable electrostatic plate makes electrical and mechanical contact with a signal output terminal in response to the electromagnetic force, and breaks electrical and mechanical contact with the signal output terminal in response to an absence of the electromagnetic force.

7. The array of claim 1, wherein the first movable electrostatic plate has a first lateral bending mode, the second movable electrostatic plate has a second lateral bending mode, and the first and second lateral bending modes are different.

8. The array of claim 1, wherein the MEMS array is packaged in a vacuum.

9. A microelectromechanical system (MEMS) varactor array comprising:
   a first MEMS device, including:
      a first fixed electrostatic plate coupled to a first input signal terminal;
      a second fixed electrostatic plate coupled to a first output signal terminal;
      a first movable electrostatic plate elastically connected to a first structure, the first movable electrostatic plate having a first mass, and the first movable electrostatic plate forming first and second capacitors with the first and second fixed electrostatic plates, respectively;
      a first drive circuit having a first drive output coupled to the first movable electrostatic plate;
      a first filter coupled to the first drive output, the first filter having a first frequency response producing a first resonant frequency in the first fixed electrostatic plate; and
   a second MEMS device, including:
      a third fixed electrostatic plate coupled to a second input signal terminal;
      a fourth fixed electrostatic plate coupled to a second output signal terminal;
      a second movable electrostatic plate elastically connected to a second structure, the second movable electrostatic plate having a second mass that is different than the first mass, and the second movable electrostatic plate forming third and fourth capacitors with the third and fourth fixed electrostatic plates, respectively; and
      a second drive circuit having a second drive output coupled to the second movable electrostatic plate; and
      a second filter coupled to the second drive output, the second filter having a second frequency response, the second frequency response different than the first frequency response producing a second resonant frequency in the second fixed electrostatic plate that is different than the first resonant frequency.

10. The array of claim 9, wherein:
the first and second movable electrostatic plates have material added to their periphery, increasing their respective masses; and
the masses of the material added are different between the first and second movable electrostatic plates.

11. The array of claim 9, wherein:
the first and second movable electrostatic plates have cutouts having first and second cutout patterns, respectively, the cutouts decreasing the first mass and the second mass; and
the first and second cutout patterns are different.

12. The array of claim 11, wherein the first and second movable electrostatic plates also have material added to their periphery, and the masses of the material added are different between the first and second movable electrostatic plates.

13. The array of claim 9, wherein the first movable electrostatic plate is attracted toward the first fixed electrostatic plate by an electromagnetic force.

14. The array of claim 9, wherein the first movable electrostatic plate has a first lateral bending mode, the second movable electrostatic plate has a second lateral bending mode, and the first and second lateral bending modes are different.

15. A microelectromechanical system (MEMS) array comprising:
a first MEMS device, including:
  a first movable electrostatic plate elastically connected to a first structure;
  a first fixed electrostatic plate;
  a first drive circuit having a first drive output coupled to the first fixed electrostatic plate, and providing a first drive signal;
  a first signal input terminal coupled to one of either the first movable electrostatic plate or the first fixed electrostatic plate; and
  a first filter coupled to the first drive output, the first filter having a first frequency response producing a first resonant frequency in the first fixed electrostatic plate; and
a second MEMS device, including:
  a second movable electrostatic plate elastically connected to a second structure;
  a second fixed electrostatic plate;
  a second drive circuit having a second drive output coupled to the second fixed electrostatic plate, and providing a second drive signal;
  a second signal input terminal coupled to one of the second movable electrostatic plate or the second fixed electrostatic plate; and
  a second filter coupled to the second drive output, the second filter having a second frequency response, the second frequency response different than the first frequency response producing a second resonant frequency in the second fixed electrostatic plate that is different than the first resonant frequency.

16. The array of claim 15, wherein the first filter includes a first filter resistor and a first filter capacitor, and the second filter includes a second filter resistor and a second filter capacitor.

17. The array of claim 16, wherein the first and second filter resistors have the same resistance, and the first and second filter capacitors have different capacitances.

18. The array of claim 16, wherein the first and second filter capacitors have the same capacitance, and the first and second filter resistors have different resistances.

19. The array of claim 15, wherein a rise time of the second drive signal is longer than a rise time of the first drive signal.

20. The array of claim 15, wherein a fall time of the second drive signal is longer than a fall time of the first drive signal.

* * * * *